(12) United States Patent
Sato

(10) Patent No.: US 9,312,317 B2
(45) Date of Patent: Apr. 12, 2016

(54) ORGANIC ELECTROLUMINESCENT DISPLAY DEVICE AND METHOD FOR MANUFACTURING THE SAME

(71) Applicant: Japan Display Inc., Tokyo (JP)

(72) Inventor: Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/480,823

(22) Filed: Sep. 9, 2014

(65) Prior Publication Data

US 2015/0069360 A1 Mar. 12, 2015

(30) Foreign Application Priority Data

Sep. 9, 2013 (JP) ................................. 2013-186141

(51) Int. Cl.
*H01L 27/32* (2006.01)

(52) U.S. Cl.
CPC .................................. *H01L 27/3246* (2013.01)

(58) Field of Classification Search
CPC .............. G09G 2320/0233; G09G 2300/0439; G09G 2300/0809; G09G 2320/02; G09G 2320/0238; G09G 2300/0465; H01L 27/3246; H01L 27/3276; H01L 51/5284; H01L 27/326; H01L 27/3248; H01L 27/3258; H01L 27/3272
See application file for complete search history.

(56) References Cited

U.S. PATENT DOCUMENTS

| 2012/0248467 | A1* | 10/2012 | Yokoyama et al. | ............. 257/88 |
| 2014/0077171 | A1* | 3/2014 | Yamakita et al. | ............... 257/40 |
| 2014/0239272 | A1* | 8/2014 | Kim | ................................ 257/40 |

FOREIGN PATENT DOCUMENTS

| JP | 2008-123879 A | 5/2008 |
| JP | 2012-234748 A | 11/2012 |

* cited by examiner

*Primary Examiner* — Roy Potter
*Assistant Examiner* — Paul Patton
(74) *Attorney, Agent, or Firm* — Typha IP LLC

(57) ABSTRACT

An organic electroluminescent display device includes a substrate, plural pixel electrodes that are disposed on the substrate, an insulating layer that is disposed in areas between the pixel electrodes adjacent to each other, and extends integrally to upper and lower portions of ends of the pixel electrodes adjacent to each other, an organic electroluminescent film that is disposed on the substrate with the inclusion of a common layer that continuously covers the plural pixel electrodes and the insulating layer; and a common electrode that is disposed on the organic electroluminescent film.

17 Claims, 10 Drawing Sheets

ORGANIC ELECTROLUMINESCENT DISPLAY DEVICE AND METHOD FOR MANUFACTURING THE SAME

CROSS-REFERENCE TO RELATED APPLICATION

The present application claims priority from Japanese application JP2013-186141 filed on Sep. 9, 2013, the content of which is hereby incorporated by reference into this application.

BACKGROUND OF THE INVENTION

1. Field of the Invention

The present invention relates to an organic electroluminescent display device, and a method for manufacturing the same.

2. Description of the Related Art

An organic electroluminescent display device has a structure in which an organic film is sandwiched between an anode and a cathode (refer to JP 2012-234748 A). As usual, plural organic films are laminated on each other, and one of those organic films is a light emitting layer. In order to obtain light emission of one color (for example, white) in plural pixels, the organic film for making the light emitting layer is wholly continuously formed (refer to JP 2008-123879 A). Alternatively, in order to obtain the light emission of plural colors in the plural pixels, the organic film for making the light emitting layer is separated for each of pixels, but the organic film for making a hole injection layer, an electron injection layer, a hole transport layer, an electron transport layer, or the like is continuously formed. Even in any case, at least one organic film is continuously formed over the pixels adjacent to each other.

SUMMARY OF THE INVENTION

In a high-quality display device, the pixels adjacent to each other come closer to each other by miniaturization of the pixels. For that reason, a light generated in any pixel may penetrate to the adjacent pixels. If colors of the pixels adjacent to each other are different from each other, there arises such a problem that the colors are mixed together. JP 2012-234748 A and JP 2008-123879 A fail to disclose the problem on the color mixture.

The present invention relates to the prevention of color mixture in pixels adjacent to each other.

(1) According to the present invention, there is provided an organic electroluminescent display device, including: a substrate; a plurality of pixel electrodes that are disposed on the substrate; an insulating layer that is disposed in areas between the pixel electrodes adjacent to each other, and extends integrally to upper and lower portions of ends of the pixel electrodes adjacent to each other; an organic electroluminescent film that is disposed on the substrate with the inclusion of a common layer that continuously covers the plurality of pixel electrodes and the insulating layer; and a common electrode that is disposed on the organic electroluminescent film. According to the present invention, since the insulating layer rests on the ends of the pixel electrodes, short-circuiting between the ends of the pixel electrodes and the common electrode can be prevented. The insulating layer extends integrally to the upper and lower portions of the ends of the pixel electrodes. For that reason, since the insulating layer can be thinly formed on the ends of the pixel electrodes, a curvature of the organic electroluminescent film toward a swelling direction thereof can be reduced. With this configuration, since light that has penetrated to the adjacent pixels hardly travels upward, the color mixture of the pixels adjacent to each other can be prevented.

(2) In the organic electroluminescent display device according to the item (1), the insulating layer may have a concave portion recessed in an upper surface thereof, and the common layer may be curved along the concave portion.

(3) In the organic electroluminescent display device according to the item (2), a bottom surface of the concave portion of the insulating layer may be located at a position lower than upper surfaces of the plurality of pixel electrodes, and a lower surface of the common layer may be located at a position lower than the upper surfaces of the plurality of pixel electrodes above the concave portion of the insulating layer.

(4) In the organic electroluminescent display device according to the item (2) or (3), the common electrode may be curved along a curvature of the common layer, the organic electroluminescent display device may further include a sealing layer that conducts sealing to cover the organic electroluminescent film and the common electrode, and a lower surface of the sealing layer may have irregularity along the curvature of the common layer.

(5) In the organic electroluminescent display device according to the item (4), the sealing layer may include a plurality of layers, a lowermost layer of the sealing layer may be curved along the curvature of the common electrode, and an uppermost layer of the sealing layer may be flat on an upper surface thereof.

(6) In the organic electroluminescent display device according to any one of the items (1) to (5), a wiring layer may be disposed over the substrate below the plurality of pixel electrodes, and each of the pixel electrodes may have a connection portion extended downward so as to be connected to the wiring layer.

(7) In the organic electroluminescent display device according to the item (6), the connection portion may be disposed to be bent toward the wiring layer with the avoidance of the ends of the pixel electrodes, and the insulating layer may be disposed to extend from the ends to an upper portion of the connection portion.

(8) In the organic electroluminescent display device according to the item (6), the connection portion may be bent toward the wiring layer with the inclusion of the ends of the pixel electrodes.

(9) According to the present invention, there is provided a method for manufacturing an organic electroluminescent display device, including the steps of: forming an underlying layer on a substrate; forming a conductive layer on the underlying layer; patterning the conductive layer into a shape of a plurality of pixel electrodes; patterning the underlying layer so as to overhang ends of the plurality of pixel electrodes; forming an insulating layer to cover the plurality of pixel electrodes and the underlying layer so as to extend between the pixel electrodes adjacent to each other, and below the ends of the plurality of pixel electrodes; patterning the insulating layer so as to expose at least center portions of the respective pixel electrodes except for the ends thereof; forming an organic electroluminescent film with the inclusion of a common layer that continuously covers exposed areas of the plurality of pixel electrodes from the insulating layer, and the insulating layer; and forming a common electrode on the organic electroluminescent film. According to the present invention, since the insulating layer rests on the ends of the pixel electrodes, short-circuiting between the ends of the pixel electrodes and the common electrode can be prevented. The insulating layer extends integrally to the upper and lower portions of the ends of the pixel electrodes without conducting a complicated step such as half exposure.

(10) The method for manufacturing an organic electroluminescent display device according to the item (9) may further include the step of forming a mask layer having the shape of the plurality of pixel electrodes on the conductive layer before patterning the conductive layer, in which a portion of the conductive layer exposed from the mask layer may be removed in the step of patterning the conductive layer.

(11) In the method for manufacturing an organic electroluminescent display device according to the item (10), a portion of the insulating layer exposed from the mask layer may be removed in the step of patterning the insulating layer.

(12) In the method for manufacturing an organic electroluminescent display device according to the item (10), a portion of the insulating layer exposed from the plurality of pixel electrodes may be removed after removing the mask layer in the step of patterning the insulating layer.

DETAILED DESCRIPTION OF THE INVENTION

Hereinafter, embodiments of the present invention will be described with reference to the accompanying drawings.

Figure 1:
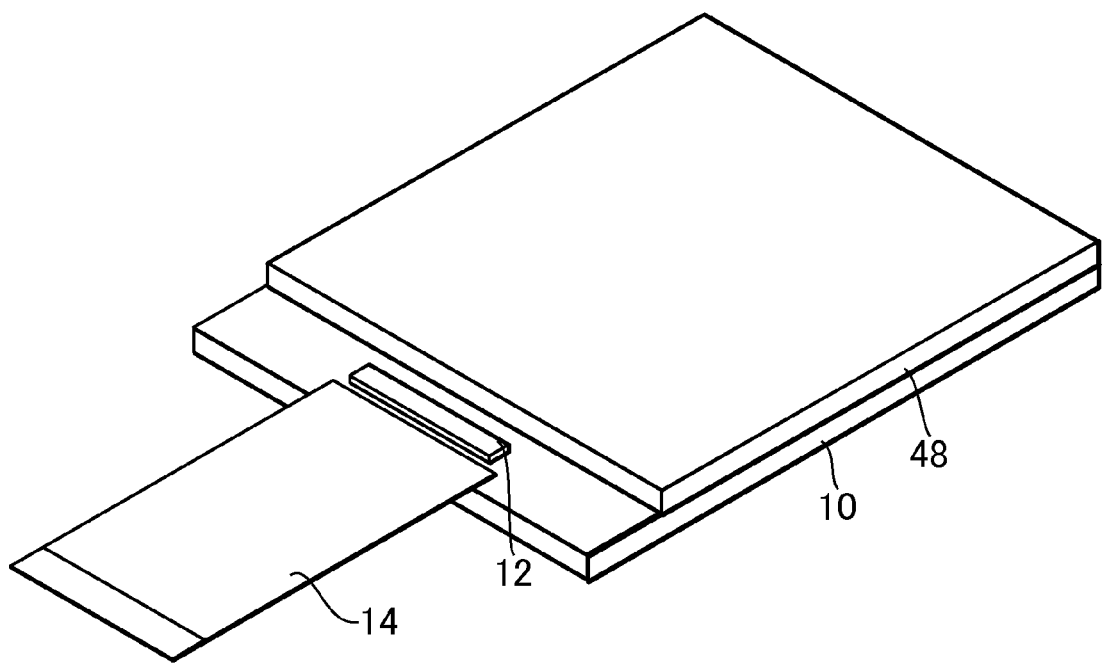
FIG. 1 is a perspective view of an organic electroluminescent display device according to an embodiment of the present invention.

FIG. 1 is a perspective view of an organic electroluminescent display device according to an embodiment of the present invention. The organic electroluminescent display device includes a first substrate 10 having an optical transparency made of glass or the like. The first substrate 10 has an image display area for image display. An integrated circuit chip 12 for driving elements for displaying an image is mounted on the first substrate 10. The first substrate 10 is connected with a flexible wiring substrate 14 for electric connection with an external.

Figure 2:
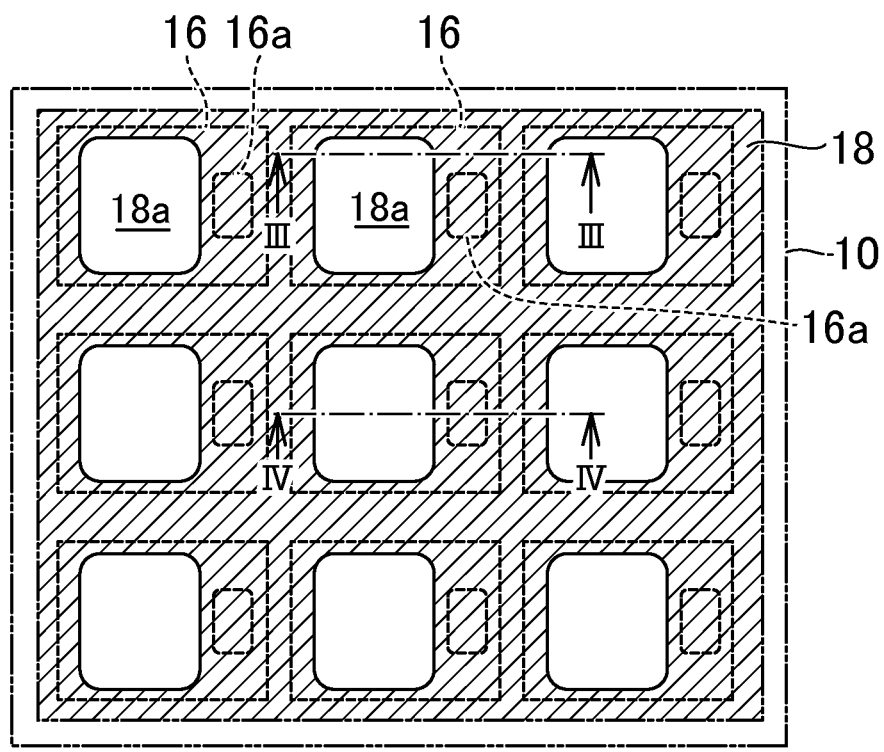
FIG. 2 is a partially enlarged plan view of the organic electroluminescent display device illustrated in FIG. 1.

FIG. 2 is a partially enlarged plan view of the organic electroluminescent display device illustrated in FIG. 1. Plural pixel electrodes 16 are disposed on the first substrate 10. The pixel electrodes 16 form anodes. The plural pixel electrodes 16 are arrayed in a vertical direction and a horizontal direction. An insulating layer 18 is so disposed as to rest on ends of the pixel electrodes 16. The insulating layer 18 is configured to surround the peripheries of the respective pixel electrodes 16. In other words, the insulating layer 18 has openings 18a from which center portions of the pixel electrodes 16 are exposed.

Figure 3:
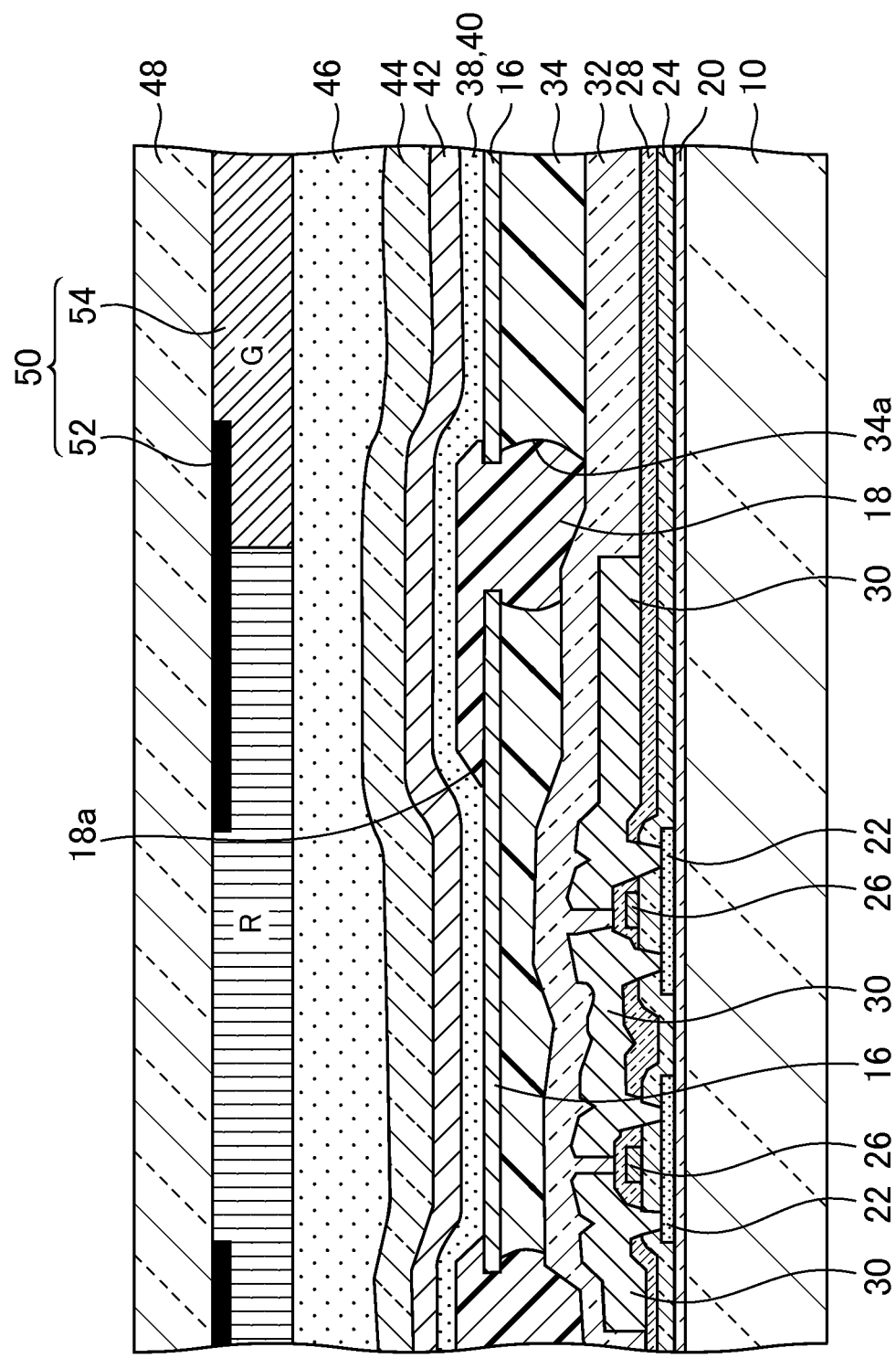
FIG. 3 is a cross-sectional view of the organic electroluminescent display device taken along a line III-III illustrated in FIG. 2.
Figure 4:
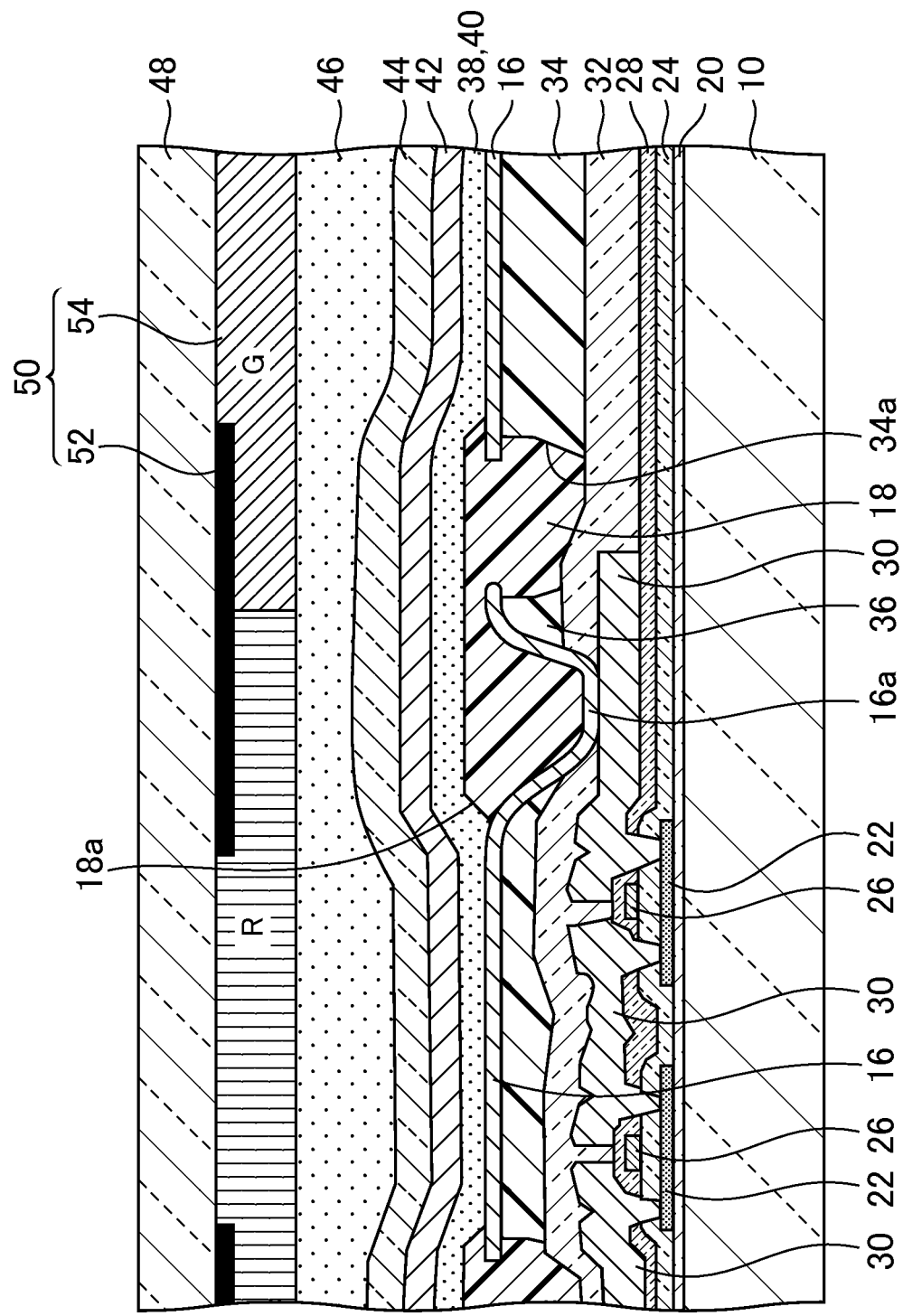
FIG. 4 is a cross-sectional view of the organic electroluminescent display device taken along a line IV-IV illustrated in FIG. 2.

FIG. 3 is a cross-sectional view of the organic electroluminescent display device taken along a line III-III illustrated in FIG. 2. FIG. 4 is a cross-sectional view of the organic electroluminescent display device taken along a line IV-IV illustrated in FIG. 2.

The first substrate 10 is formed with an undercoat 20 that functions as a barrier against impurities from the first substrate 10, and a semiconductor layer 22 is formed on the undercoat 20. A gate insulating film 24 is formed to cover the semiconductor layer 22. A gate electrode 26 is formed on the gate insulating film 24, and an interlayer insulating film 28 is formed to cover the gate electrode 26. Plural wiring layers 30 are disposed on the first substrate 10 (on the interlayer insulating film 28). Apart of the wiring layers 30 penetrates through the interlayer insulating film 28, and functions as a source electrode or a drain electrode on the semiconductor layer 22, and forms a thin film transistor. A passivation film 32 is formed on the interlayer insulating film 28 so as to cover the wiring layers 30. Since an upper surface of the passivation film 32 becomes irregular, an underlying layer 34 is formed for the purpose of planarizing the passivation film 32. The underlying layer 34 is made of resin such as acrylic resin.

The pixel electrodes 16 are disposed on the underlying layer 34. The pixel electrodes 16 form anodes. The wiring layers 30 are disposed below the plural pixel electrodes 16. As illustrated in FIG. 4, each of the pixel electrodes 16 has a connection portion 16a extending downward so as to be connected to the wiring layer 30. The connection portion 16a is disposed to be bent toward the wiring layer 30 with the avoidance of the end of each pixel electrode 16. The pixel electrodes 16 each penetrate through the underlying layer 34, and are electrically connected to the wiring layers 30.

The underlying layer 34 has a hole 34a (for example, through-hole) between the pixel electrodes 16 adjacent to each other. The hole 34a is shaped to enter a lower portion of the end of each pixel electrode 16. That is, the end of the pixel electrode 16 is overhung from the opening of the hole 34a. As illustrated in FIG. 4, the underlying layer 34 has a partition part 36 between the hole 34a formed between the pixel electrodes 16 adjacent to each other, and the connection portion 16a of one pixel electrode 16.

The insulating layer 18 is disposed in the hole 34a of the underlying layer 34. The insulating layer 18 is disposed between the pixel electrodes 16 adjacent to each other. The insulating layer 18 extends below the end of the pixel electrode 16. Also, the insulating layer 18 rests on the end of the pixel electrode 16. That is, the insulating layer 18 extends integrally to upper and lower portions of the ends of the pixel electrodes 16 adjacent to each other. Further, as illustrated in FIG. 4, the insulating layer 18 extends from the end of the pixel electrode 16 to the upper portion of the connection portion 16a.

An organic electroluminescent film 38 is disposed over the first substrate 10. The organic electroluminescent film 38 is configured to rest on the plural pixel electrodes 16 and the insulating layer 18. The organic electroluminescent film 38 is formed of plural layers although not shown, includes at least a light emitting layer, and further includes at least one layer of an electron transport layer, a hole transport layer, an electron injection layer, and a hole injection layer. The light emitting layer is configured to emit only a light of one color (for example, white).

The organic electroluminescent film 38 includes a common layer 40 that continuously covers the plural pixel electrodes 16 and the insulating layer 18. In an example illustrated in FIGS. 2 and 3, the overall organic electroluminescent film 38 forms the common layer 40. Alternatively, at least one layer (except for at least one layer) of the organic electroluminescent film 38 formed of the plural layers may be formed by the common layer 40 (for example, the electron injection layer), and the remaining layers formed of at least one layer may be cut for each of the pixel electrodes 16. In the organic electroluminescent film with a tandem structure including two or more light emitting layers, a charge generation layer for supplying electrons and holes which is arranged between the light emitting layers adjacent to each other may be formed by the common layer 40.

A common electrode 42 is disposed on the organic electroluminescent film 38. The common electrode 42 is a cathode. A voltage is applied to the pixel electrodes 16 and the common electrode 42 to inject holes and electrons into the organic electroluminescent film 38 from the respective electrodes 16 and 42. The injected holes and electrons are coupled together in the light emitting layer to emit a light. Since the insulating layer 18 is interposed between the end of the pixel electrode 16 and the common electrode 42, short-circuiting between the pixel electrode 16 and the common electrode 42 is prevented.

According to this embodiment, since the insulating layer 18 rests on the ends of the pixel electrodes 16, short-circuiting between the ends of the pixel electrodes 16 and the common electrode 42 can be prevented. The insulating layer 18 extends integrally to the upper and lower portions of the ends of the pixel electrodes 16. For that reason, since the insulating layer 18 can be thinly formed on the ends of the pixel electrodes 16, a curvature of the organic electroluminescent film 38 toward a swelling direction thereof can be reduced. With this configuration, since light that has penetrated to the adjacent pixels hardly travels upward, the color mixture of the pixels adjacent to each other can be prevented.

A sealing layer 44 is disposed on the common electrode 42. The sealing layer 44 seals the organic electroluminescent film 38 so as to block moisture. A filler layer 46 is disposed on the sealing layer 44.

A second substrate 48 is arranged to face the first substrate 10 at an interval. A color filter 50 is disposed on a surface of the second substrate 48 on the first substrate 10 side. The color filter 50 includes a black matrix 52 and a colored layer 54. Since a light emitting layer (not shown) of the above organic electroluminescent film 38 emits the light of a single color (for example, white), the color filter 50 is provided to enable full color display in this embodiment. When the organic electroluminescent film 38 includes plural light emitting layers that emit the light of different colors (for example, red, green, blue), since the light emitting layers emit the light of the plural colors, the colored layer 54 is not required. The filler layer 46 is disposed between the first substrate 10 and the second substrate 48.

FIGS. 5A to 6B are diagrams illustrating a method for manufacturing the organic electroluminescent display device according to the embodiment of the present invention.

Figure 5A:
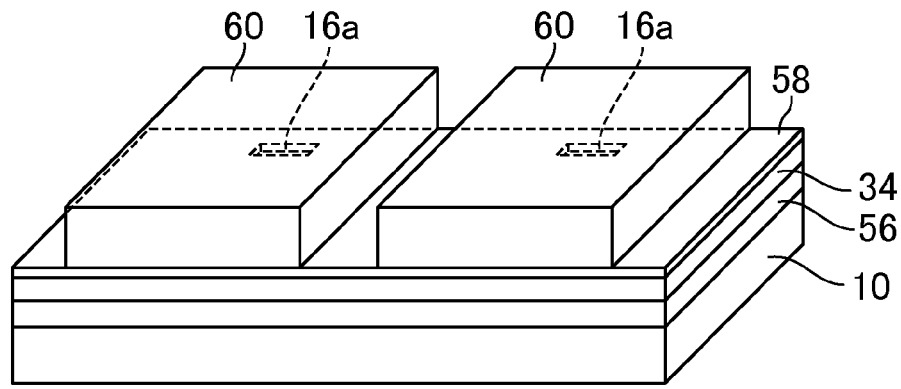
FIGS. 5A to 5C are diagrams illustrating a method for manufacturing the organic electroluminescent display device according to the embodiment of the present invention.

As illustrated in FIG. 5A, the first substrate 10 is prepared. A circuit layer 56 is disposed on the first substrate 10. The circuit layer 56 includes plural layers including the passivation film 32 and so on laminated over the first substrate 10, as illustrated in FIGS. 3 and 4. The underlying layer 34 is formed on the circuit layer 56. A conductive layer 58 is formed on the underlying layer 34. The conductive layer 58 is formed with the inclusion of the connection portion 16a. A mask layer 60 having a shape of the plurality of pixel electrodes 16 is formed on the conductive layer 58. The mask layer 60 is patterned through photolithography.

Figure 5B:
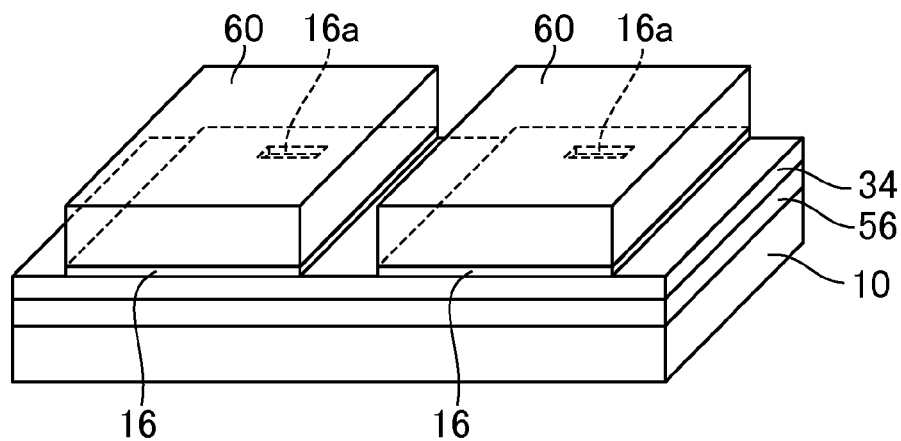

As illustrated in FIG. 5B, the conductive layer 58 is patterned into the shape of the plurality of pixel electrodes 16. In detail, a portion of the conductive layer 58 exposed from the mask layer 60 is removed by wet etching or the like. When the conductive layer 58 is formed of plural different layers, for example, made of indium tin oxide and silver, the conductive layer 58 is etched by respective different solutions.

Figure 5C:
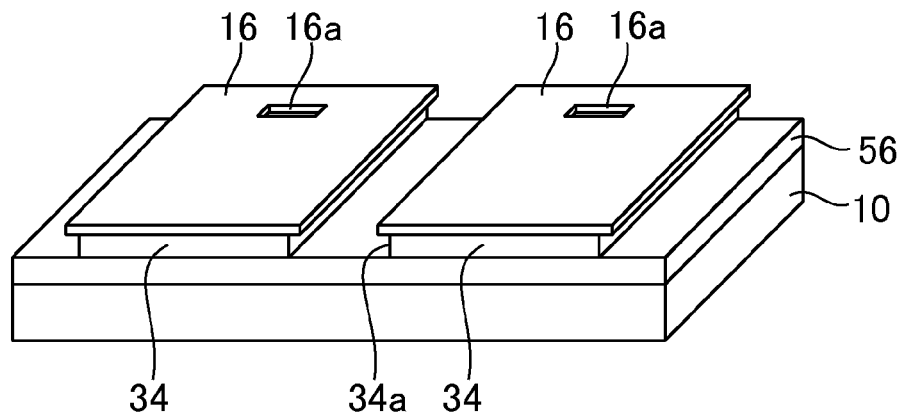

As illustrated in FIG. 5C, the underlying layer 34 is so patterned as to overhang the ends of the plural pixel electrodes 16. Ashing can be applied to patterning. The patterning is conducted by removing a portion of the insulating layer 18 exposed from the mask layer 60. Alternatively, after the mask layer 60 has been removed, portions of the insulating layer 18 exposed from the plural pixel electrodes 16 may be removed with the plural pixel electrodes 16 as a mask.

Figure 6A:
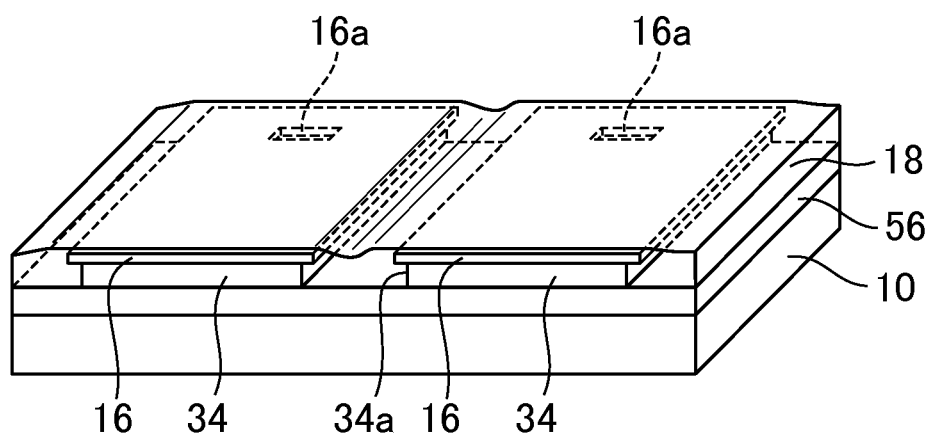
FIGS. 6A and 6B are diagrams illustrating a method for manufacturing the organic electroluminescent display device according to the embodiment of the present invention.

As illustrated in FIG. 6A, the insulating layer 18 is formed to cover the plural pixel electrodes 16 and the underlying layer 34. The insulating layer 18 is formed to extend between the pixel electrodes 16 adjacent to each other, and below the ends of the plural pixel electrodes 16. The insulating layer 18 is formed to enter the hole 34a of the underlying layer 34. The insulating layer 18 can be formed to extend integrally to the upper and lower portions of the ends of the pixel electrodes 16 without conducting a complicated step such as half exposure. Also, when the insulating layer 18 is made of a liquid material, even if the viscosity of the material is high, the insulating layer 18 can be thinly formed on the ends of the pixel electrodes 16.

Figure 6B:
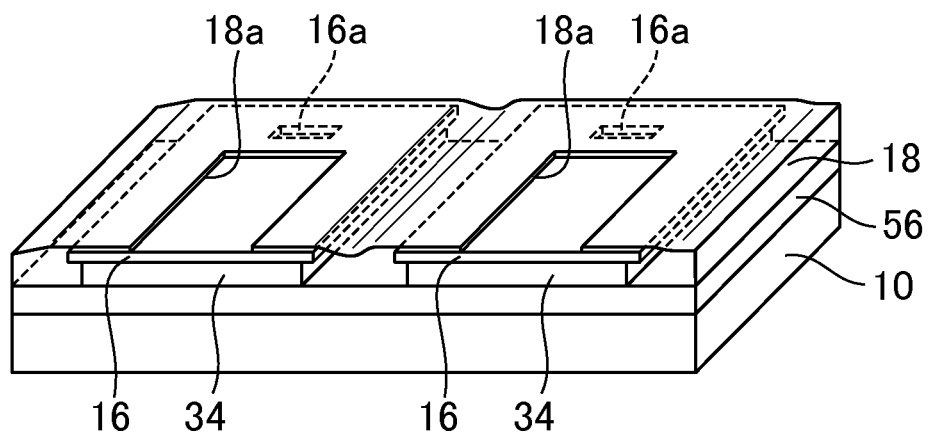

As illustrated in FIG. 6B, the insulating layer 18 is patterned to expose at least center portions of the respective pixel electrodes 16 except for the ends of the pixel electrodes 16. That is, the openings 18a are formed in the insulating layer 18.

Thereafter, as illustrated in FIGS. 3 and 4, the organic electroluminescent film 38 is formed with the inclusion of the common layer 40 that continuously covers exposed areas of the plural pixel electrodes 16 from the insulating layer 18, and the insulating layer 18. Then, the common electrode 42 is formed on the organic electroluminescent film 38. Since the insulating layer 18 rests on the ends of the pixel electrodes 16, short-circuiting between the ends of the pixel electrodes 16 and the common electrode 42 can be prevented.

Further, as illustrated in FIGS. 3 and 4, the second substrate and the color filter 50 are disposed. According to this embodiment, since the insulating layer 18 can be thinned on the pixel electrodes 16, a thickness between the first substrate 10 and the second substrate 48 can be thinned.

Figure 7:
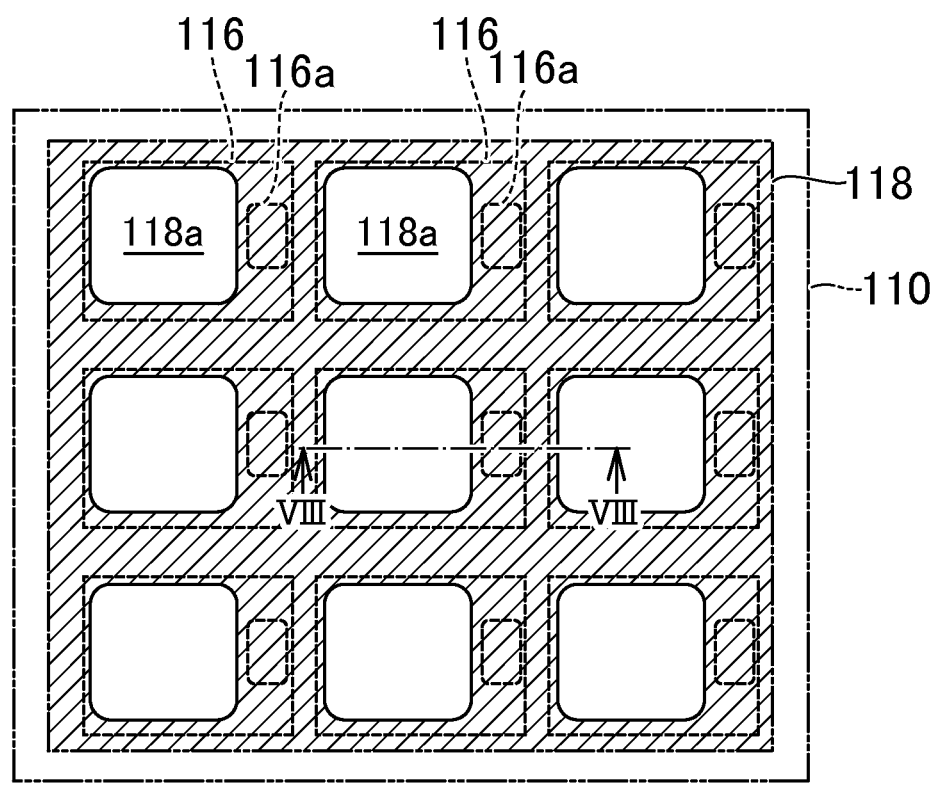
FIG. 7 is a partially enlarged plan view of an organic electroluminescent display device according to a modification 1 of the embodiment.
Figure 8:
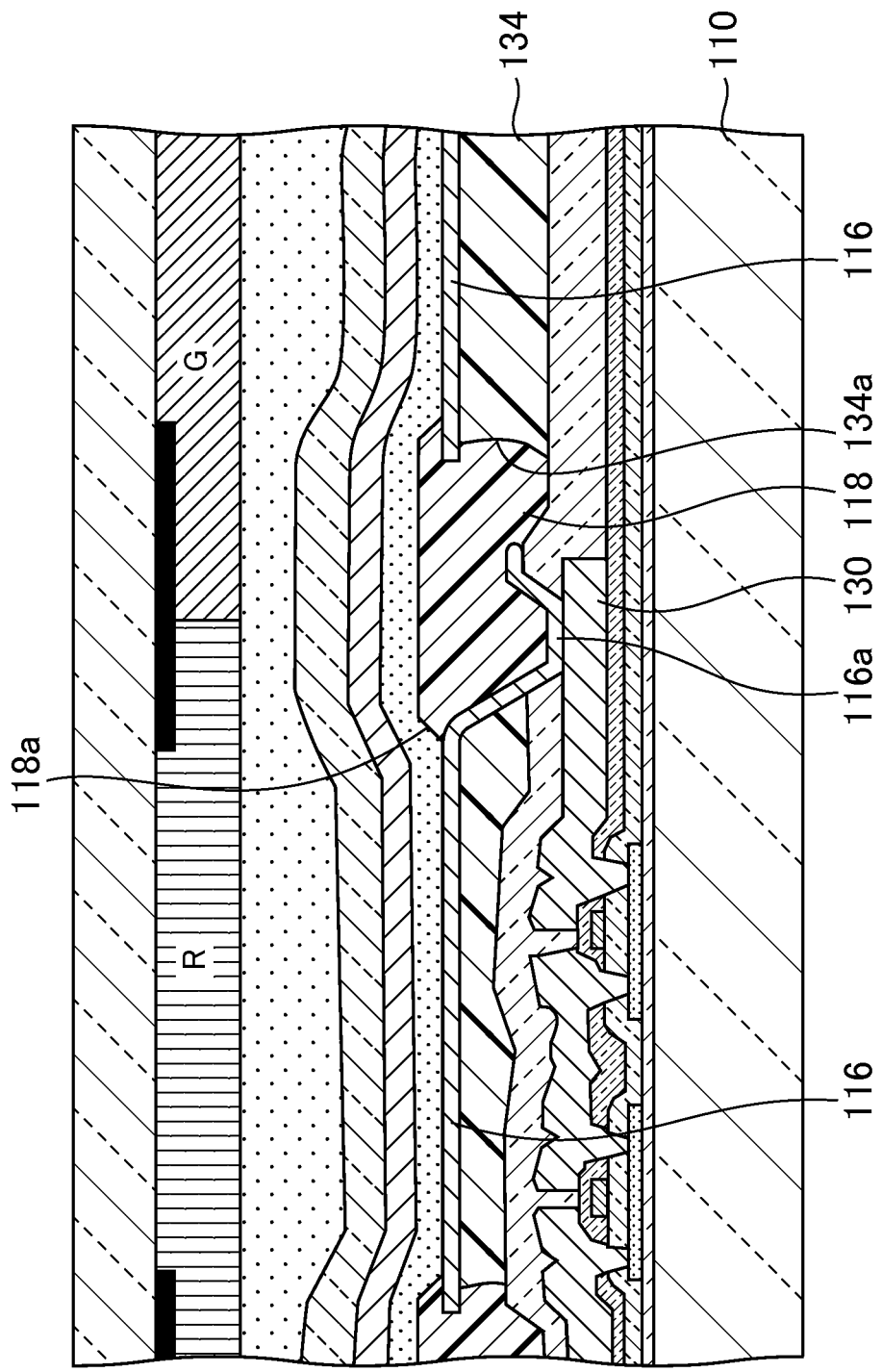
FIG. 8 is a cross-sectional view of the organic electroluminescent display device taken along a line VIII-VIII illustrated in FIG. 7.

FIG. 7 is a partially enlarged plan view of an organic electroluminescent display device according to a modification 1 of the embodiment. FIG. 8 is a cross-sectional view of the organic electroluminescent display device taken along a line VIII-VIII illustrated in FIG. 7. This example is different from the above embodiment (FIG. 4) in that a connection portion 116a is bent toward a wiring layer 130 with the inclusion of the end of each of pixel electrodes 116.

Therefore, the end of the pixel electrode 116 is also arranged in a hole 134a of an underlying layer 134. Since the connection portion 116a is disposed on the end of the pixel electrode 116, and separated from a center portion of the pixel electrode 116, each opening 118a of an insulating layer 118 for exposing the center portion of each pixel electrode 116 can be enlarged.

The hole 134a of the underlying layer 134 is largely formed so as to extend from an area between the pixel electrodes 116 adjacent to each other to an end (connection portion 116a) of one pixel electrode 116. For that reason, the liquid material for forming the insulating layer 118 is liable to be filled. On the contrary, the underlying layer 34 illustrated in FIG. 4 has the partition part 36 between the hole 34a formed between the pixel electrodes 16 adjacent to each other, and the connection portion 16a of one pixel electrode 16. Therefore, the liquid material for forming the insulating layer 18 is accumulated on the connection portion 16a.

The other details correspond to those described in the embodiments. For example, the wiring layer 130 is disposed below the plural pixel electrodes 116 in a first substrate 110, and the connection portion 116a of the pixel electrode 116 extends downward so as to be connected to the wiring layer 130.

Figure 9:
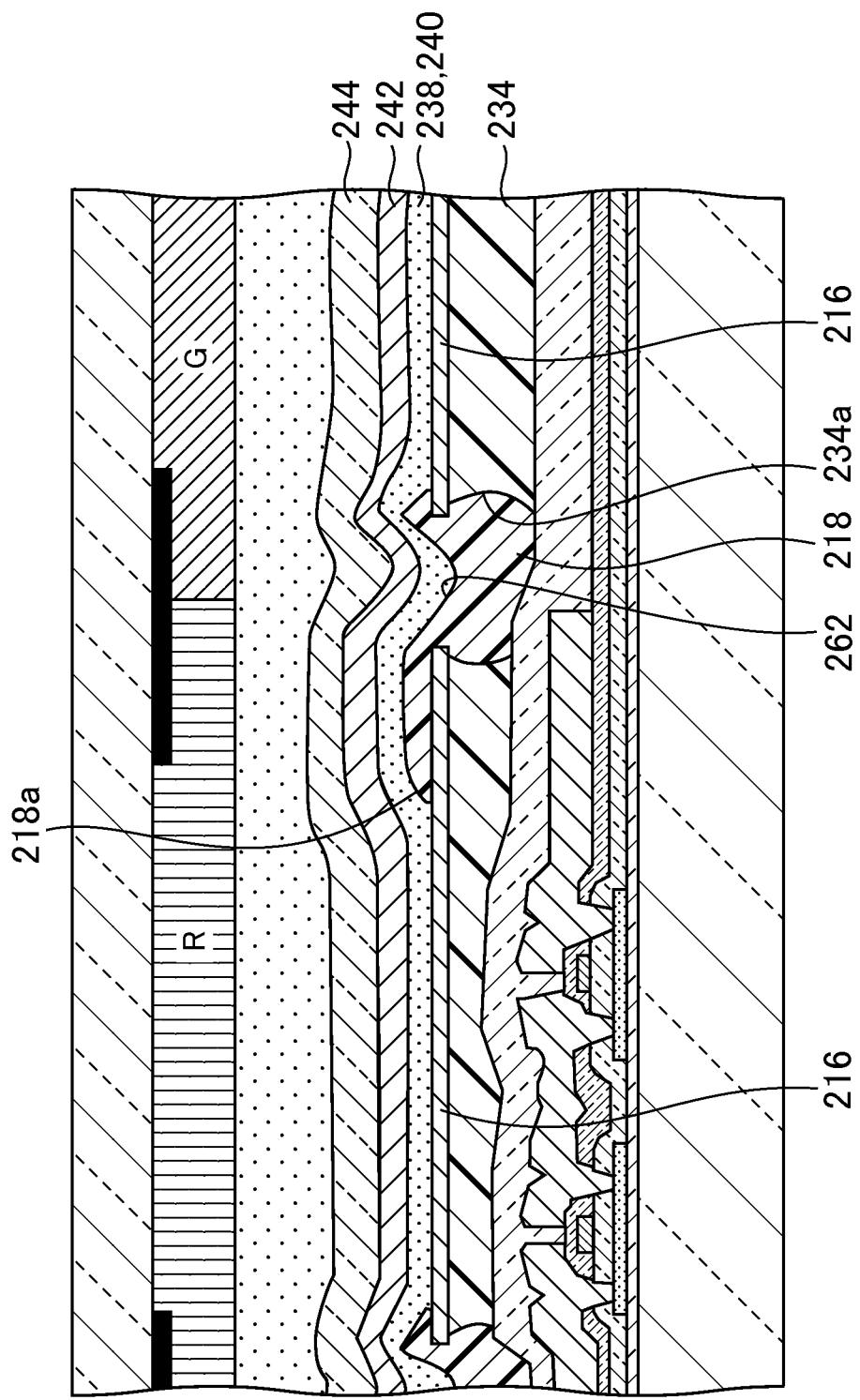
FIG. 9 is a cross-sectional view of an organic electroluminescent display device according to a modification 2 of the embodiment.

FIG. 9 is a cross-sectional view of an organic electroluminescent display device according to a modification 2 of the embodiment. In this example, an insulating layer 218 has a concave portion 262 recessed in an upper surface thereof. The concave portion 262 is formed with the avoidance of above of the end of each pixel electrode 216. That is, the concave portion 262 is formed above a hole 234a of an underlying layer 234. If the viscosity of a liquid material for forming the insulating layer 218 is set to be higher, the concave portion 262 is formed. A bottom surface of the concave portion 262 is located at a position lower than an upper surface of the pixel electrode 216.

A common layer 240 is curved along the concave portion 262. Since the insulating layer 218 is thin on the pixel electrodes 216, a curvature of the common layer 240 in a swelling direction is small. On the other hand, the common layer 240 is curved downwardly along an inner surface of the concave portion 262 of the insulating layer 218. A lower surface of the common layer 240 is located at a position lower than the upper surface of the pixel electrode 216 above the concave portion 262 of the insulating layer 218. When the common layer 240 is curved downwardly, the waveguide of light can be prevented, and the color mixture caused by the entrance of the light from the adjacent pixels can be reduced.

A common electrode 242 is curved along a curvature of the common layer 240. An organic electroluminescent film 238 and the common electrode 242 are covered and sealed with a sealing layer 244. The sealing layer 244 has irregularities on a lower surface thereof along the curvature of the common electrode 242.

Figure 10:
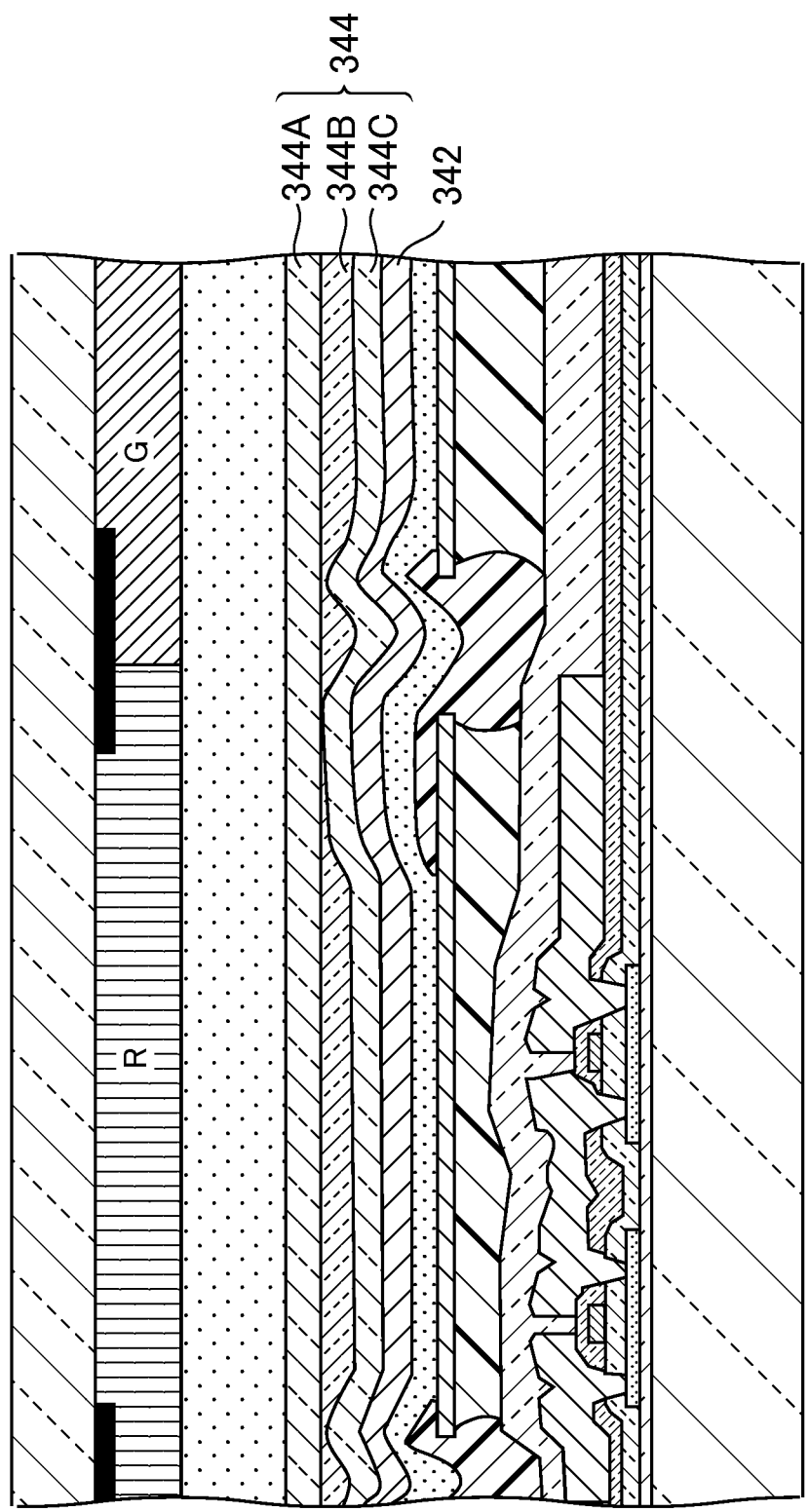
FIG. 10 is a cross-sectional view of an organic electroluminescent display device according to a modification 3 of the embodiment.

FIG. 10 is a cross-sectional view of an organic electroluminescent display device according to a modification 3 of the embodiment. In this example, a sealing layer 344 is formed of plural layers (an uppermost layer 344A, an intermediate layer 334B, and a lowermost layer 344C). The lowermost layer 344C of the sealing layer 344 is curved along the curvature of a common electrode 342. The uppermost layer 344A of the sealing layer 344 is flat on an upper surface thereof.

The present invention is not limited to the above embodiments, but can be variously modified. For example, the configurations described in the embodiments can be replaced with substantially the same configurations, configurations having the identical operational advantages, or configurations that can achieve the same purpose.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic electroluminescent display device, comprising:
   a substrate;
   a plurality of pixel electrodes that are disposed in the substrate;
   an insulating layer that is disposed in areas between the pixel electrodes adjacent to each other;
   an organic electroluminescent film that is disposed in the substrate with the inclusion of a common layer that continuously covers the plurality of pixel electrodes and the insulating layer; and
   a common electrode that is disposed on the organic electroluminescent film;
   wherein each of the pixel electrodes adjacent to each other has an end,
   the end includes a lower portion facing the substrate, an upper portion opposite to the lower portion, and a side portion intersects with the lower portion and the upper portion,
   the insulating layer is in contact with the lower portion, the upper portion, and the side portion, and
   the insulating layer overlaps the lower portion and the upper portion in a planar view.

2. The organic electroluminescent display device according to claim 1,
   wherein the insulating layer has a concave portion, and
   wherein the common layer is curved along the concave portion.

3. The organic electroluminescent display device according to claim 2,
   wherein a bottom surface of the concave portion of the insulating layer is located at a position lower than upper surfaces of the plurality of pixel electrodes, and
   wherein a lower surface of the common layer is located at a position lower than the upper surfaces of the plurality of pixel electrodes above the concave portion of the insulating layer.

4. The organic electroluminescent display device according to claim 2,
   wherein the common electrode is curved along a curvature of the common layer,
   wherein the organic electroluminescent display device further comprises a sealing layer that conducts sealing to cover the organic electroluminescent film and the common electrode, and
   wherein a lower surface of the sealing layer has irregularity along the curvature of the common electrode.

5. The organic electroluminescent display device according to claim 4,
   wherein the sealing layer includes a plurality of layers,
   wherein a lowermost layer of the sealing layer is curved along the curvature of the common electrode, and
   wherein an uppermost layer of the sealing layer is flat on an upper surface thereof.

6. The organic electroluminescent display device according to claim 1,
   wherein a wiring layer is disposed in the substrate below the plurality of pixel electrodes, and
   wherein each of the pixel electrodes has a connection portion extended downward so as to be connected to the wiring layer.

7. The organic electroluminescent display device according to claim 6, wherein the connection portion is disposed to be bent toward the wiring layer with the avoidance of the ends of the pixel electrodes, and wherein the insulating layer is disposed to extend from the ends to an upper portion of the connection portion.

8. The organic electroluminescent display device according to claim 6, wherein the connection portion is bent toward the wiring layer with the inclusion of the ends of the pixel electrodes.

9. A method for manufacturing an organic electroluminescent display device, comprising the steps of:

forming an underlying layer on a substrate;

forming a conductive layer on the underlying layer;

forming a mask layer having the shape of the plurality of pixel electrodes on the conductive layer;

removing a portion of the conductive layer exposed from the mask layer so as to pattern the conductive layer into a shape of a plurality of pixel electrodes;

patterning the underlying layer so as to overhang ends of the plurality of pixel electrodes;

forming an insulating layer to cover the plurality of pixel electrodes and the underlying layer so as to extend between the pixel electrodes adjacent to each other, and below the ends of the plurality of pixel electrodes;

patterning the insulating layer so as to expose at least center portions of the respective pixel electrodes except for the ends thereof;

forming an organic electroluminescent film with the inclusion of a common layer that continuously covers exposed areas of the plurality of pixel electrodes from the insulating layer, and the insulating layer; and forming a common electrode on the organic electroluminescent film.

10. The method for manufacturing an organic electroluminescent display device according to claim 9, wherein a portion of the insulating layer exposed from the mask layer is removed in the step of patterning the insulating layer.

11. The method for manufacturing an organic electroluminescent display device according to claim 9, wherein a portion of the insulating layer exposed from the plurality of pixel electrodes is removed after removing the mask layer in the step of patterning the insulating layer.

12. The organic electroluminescent display device according to claim 1, wherein the plurality of pixel electrodes include a first pixel electrode and a second pixel electrode which are adjacent to each other, the first pixel electrode has a first lower portion facing the substrate, a first upper portion opposite to the first lower portion, and a first side portion intersects with the first lower portion and the first upper portion, the second pixel electrode has a second lower portion facing the substrate, a second upper portion opposite to the second lower portion, and a second side portion intersects with the second lower portion and the second upper portion, the insulating layer is in contact with the first and second lower portions, the first and second upper portions, and the first and second side portions, and the insulating layer overlaps the first and second lower portions and the first and second upper portions in a planar view.

13. The organic electroluminescent display device according to claim 1, wherein the pixel electrodes is located on an underlying layer, the underlying layer has a hole between the pixel electrodes adjacent to each other, and the hole exposes the lower portion and is filled with the insulating layer.

14. An organic electroluminescent display device, comprising:

a substrate;

a plurality of pixel electrodes that are disposed in the substrate;

an insulating layer that is disposed in areas between the pixel electrodes adjacent to each other, and extends integrally to upper and lower portions of ends of the pixel electrodes adjacent to each other;

an organic electroluminescent film that is disposed in the substrate with the inclusion of a common layer that continuously covers the plurality of pixel electrodes and the insulating layer; and a common electrode that is disposed on the organic electroluminescent film;

wherein the insulating layer has a concave portion, wherein the common layer is curved along the concave portion, wherein a bottom surface of the concave portion of the insulating layer is located at a position lower than upper surfaces of the plurality of pixel electrodes, and wherein a lower surface of the common layer is located at a position lower than the upper surfaces of the plurality of pixel electrodes above the concave portion of the insulating layer.

15. The organic electroluminescent display device according to claim 14, wherein the common electrode is curved along a curvature of the common layer, wherein the organic electroluminescent display device further comprises a sealing layer that conducts sealing to cover the organic electroluminescent film and the common electrode, and wherein a lower surface of the sealing layer has irregularity along the curvature of the common electrode.

16. The organic electroluminescent display device according to claim 15, wherein the sealing layer includes a plurality of layers, wherein a lowermost layer of the sealing layer is curved along the curvature of the common electrode, and wherein an uppermost layer of the sealing layer is flat on an upper surface thereof.

17. The organic electroluminescent display device according to claim 14, wherein a wiring layer is disposed in the substrate below the plurality of pixel electrodes, and wherein each of the pixel electrodes has a connection portion extended downward so as to be connected to the wiring layer.

* * * * *